US012622281B2

(12) United States Patent
Takaso

(10) Patent No.: US 12,622,281 B2
(45) Date of Patent: May 5, 2026

(54) DOHERTY AMPLIFIER

(71) Applicant: Mitsubishi Electric Corporation, Tokyo (JP)

(72) Inventor: Jun Takaso, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 375 days.

(21) Appl. No.: 18/250,473

(22) PCT Filed: Apr. 7, 2021

(86) PCT No.: PCT/JP2021/014793
§ 371 (c)(1),
(2) Date: Apr. 25, 2023

(87) PCT Pub. No.: WO2022/215200
PCT Pub. Date: Oct. 13, 2022

(65) Prior Publication Data
US 2023/0411316 A1     Dec. 21, 2023

(51) Int. Cl.
*H01L 23/66* (2006.01)
*H03F 1/02* (2006.01)
*H03F 3/213* (2006.01)
(52) U.S. Cl.
CPC ........... *H01L 23/66* (2013.01); *H03F 1/0288* (2013.01); *H03F 3/213* (2013.01);
(Continued)
(58) Field of Classification Search
CPC ............. H01L 23/66; H01L 2223/6611; H01L 2223/6655; H03F 1/0288; H03F 3/213; H03F 2200/451
(Continued)

(56) References Cited

U.S. PATENT DOCUMENTS 11,190,146 B2 * 11/2021 Srinidhi Embar ...... H03F 1/565
2012/0019326 A1 1/2012 Deguchi et al.
(Continued)

FOREIGN PATENT DOCUMENTS

JP     2012-028880 A     2/2012
JP     2012-114711 A     6/2012
(Continued)

OTHER PUBLICATIONS

International Search Report issued in PCT/JP2021/014793; mailed Jun. 22, 2021.
(Continued)

*Primary Examiner* — Hafizur Rahman
(74) *Attorney, Agent, or Firm* — Studebaker Brackett PLLC

(57) ABSTRACT

A Doherty amplifier according to the present disclosure includes an input terminal, an output terminal, a carrier amplifier connected between the input terminal and the output terminal, a peak amplifier connected in parallel to the carrier amplifier between the input terminal and the output terminal, a first input matching circuit connected between the input terminal and the carrier amplifier and a second input matching circuit connected between the input terminal and the peak amplifier, wherein the carrier amplifier and the peak amplifier output signals toward outside in directions opposite to each other.

10 Claims, 7 Drawing Sheets

(52) U.S. Cl.
CPC ................. *H01L 2223/6611* (2013.01); *H01L 2223/6655* (2013.01); *H03F 2200/451* (2013.01)

(58) Field of Classification Search
USPC ........................................................ 330/1 A
See application file for complete search history.

(56) References Cited

U.S. PATENT DOCUMENTS

| | | | |
|---|---|---|---|
| 2016/0308499 A1 | 10/2016 | Kosaka et al. | |
| 2018/0013391 A1 | 1/2018 | Maalouf et al. | |
| 2019/0028062 A1 | 1/2019 | Shinjo et al. | |
| 2020/0186097 A1 | 6/2020 | Hue et al. | |
| 2021/0044261 A1 | 2/2021 | Sasaki | |
| 2021/0320625 A1* | 10/2021 | Hashinaga | H03F 3/211 |
| 2025/0080053 A1* | 3/2025 | Hashinaga | H03K 5/01 |

FOREIGN PATENT DOCUMENTS

| | | |
|---|---|---|
| JP | 2016-208090 A | 12/2016 |
| WO | 2017/145258 A1 | 8/2017 |
| WO | 2019/202631 A1 | 10/2019 |

OTHER PUBLICATIONS

An Office Action; "Notice of Reasons for Refusal," mailed by the Japanese Patent Office on Oct. 5, 2021, which corresponds to Japanese Patent Application No. 2021-541151, with English language translation.

An Office Action mailed by the State Intellectual Property Office of the People's Republic of China on Mar. 20, 2026, which corresponds to Chinese Patent Application No. 202180079110.X and is related to U.S. Appl. No. 18/250,473; with English language translation.

* cited by examiner

DOHERTY AMPLIFIER

FIELD

The present disclosure relates to a Doherty amplifier.

BACKGROUND

PTL 1 discloses a Doherty amplifier. The Doherty amplifier includes a divider that divides an input signal into two signals, a carrier amplifier to which one of the two signals is input and which includes a first field effect transistor (FET), and a peak amplifier to which the other of the two signals is input and which includes a second FET. Further, the Doherty amplifier includes a synthesizer that adjusts the impedance of an output of the carrier amplifier and an output of the peak amplifier, and synthesizes an output signal of the carrier amplifier and an output signal of the peak amplifier.

CITATION LIST

Patent Literature

[PTL 1] JP 2012-28880 A

SUMMARY

Technical Problem

In PTL 1, the carrier amplifier and the peak amplifier are closely arranged side by side. Thus, there is a possibility that a signal of the carrier amplifier and a signal of the peak amplifier interfere with each other.

An object of the present disclosure is to provide a Doherty amplifier capable of preventing interference of signals.

Solution to Problem

A Doherty amplifier according to the present disclosure includes an input terminal, an output terminal, a carrier amplifier connected between the input terminal and the output terminal, a peak amplifier connected in parallel to the carrier amplifier between the input terminal and the output terminal, a first input matching circuit connected between the input terminal and the carrier amplifier and a second input matching circuit connected between the input terminal and the peak amplifier, wherein the carrier amplifier and peak amplifier output signals toward outside in directions opposite to each other.

Advantageous Effects of Invention

In a Doherty amplifier according to the present disclosure, a carrier amplifier and a peak amplifier output signals in directions opposite to each other. It is therefore possible to prevent interference of the signals.

DESCRIPTION OF EMBODIMENTS

Figure 1:
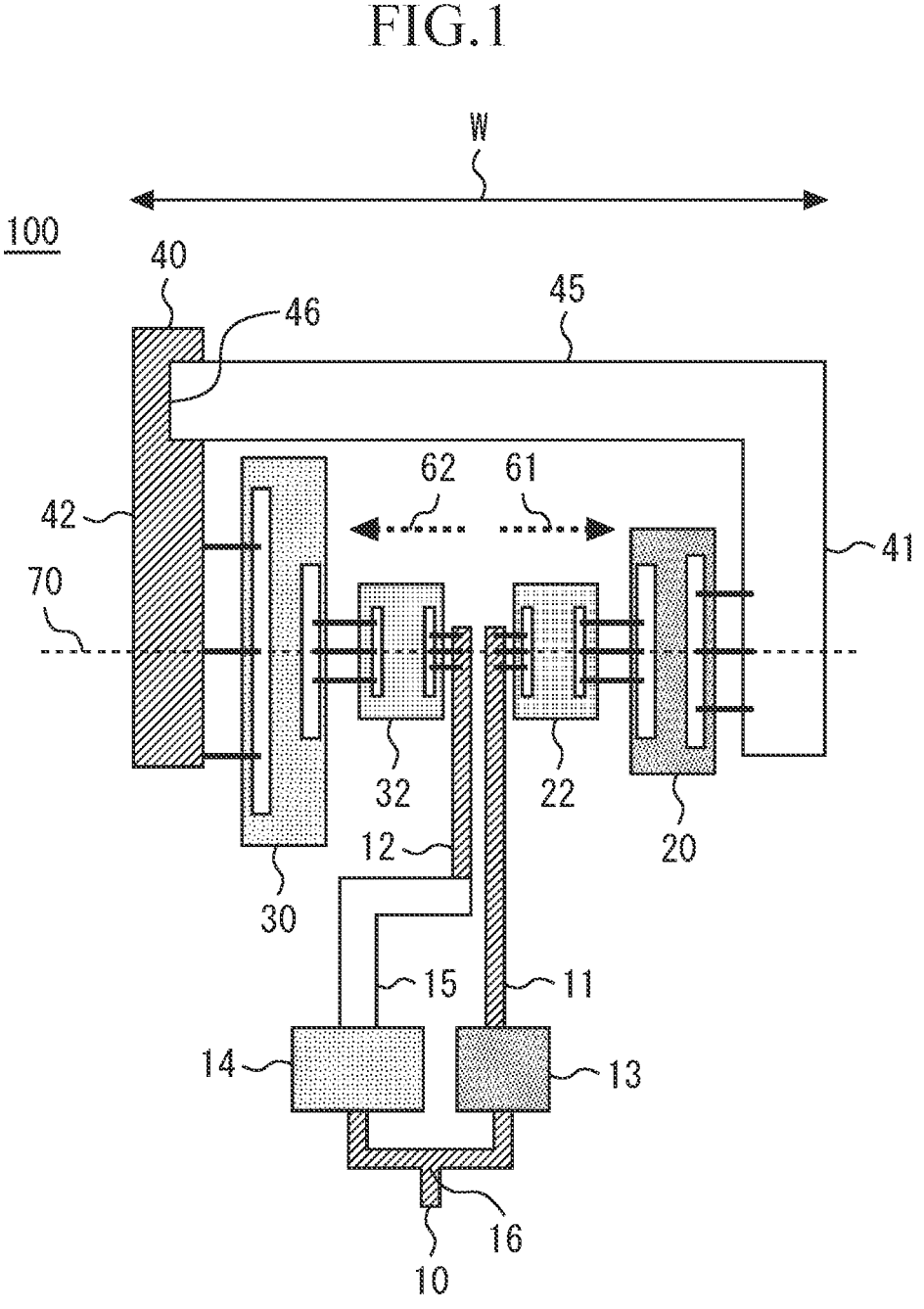
FIG. 1 is a plan view of a Doherty amplifier according to a first embodiment.

A Doherty amplifier according to each embodiment of the present disclosure is described with reference to drawings. Identical or corresponding constitutional elements are given the same reference numerals, and the repeated description of such constitutional elements may be omitted.

First Embodiment

FIG. 1 is a plan view of a Doherty amplifier 100 according to a first embodiment. The Doherty amplifier 100 includes an input terminal 10, an output terminal 40, a carrier amplifier 20 connected between the input terminal 10 and the output terminal 40, and a peak amplifier 30 connected in parallel to the carrier amplifier 20 between the input terminal 10 and the output terminal 40. The carrier amplifier 20 is also referred to as a main amplifier. The peak amplifier 30 is also referred to as an auxiliary amplifier. The carrier amplifier 20 is a transistor that amplifies a signal in a power range from a low power range to a high power range. The peak amplifier 30 is a transistor that amplifies a signal in a high power range.

A divider 16 divides an input signal from the input terminal 10 to a first input line 11 and a second input line 12. A 2-input terminal may be used as the input terminal 10 without the divider 16 being provided. A first anterior stage amplifier 13 is provided on the first input line 11. A second anterior stage amplifier 14 is provided on the second input line 12. Further, an input-side λ/4 electrical length line 15 is provided on an output side of the second anterior stage amplifier 14 on the second input line 12. The input-side λ/4 electrical length line 15 has an electrical length that is an odd multiple of λ/4 of the input signal. In other words, the electrical length of the input-side λ/4 electrical length line 15 is λ/4, 3λ/4, 5λ/4, . . . with respect to a wavelength λ of the input signal of the Doherty amplifier 100.

A first input matching circuit 22 is connected to an end portion on an opposite side of the input terminal 10, of the first input line 11. The carrier amplifier 20 is connected to output of the first input matching circuit 22. The first input matching circuit 22 is connected between the input terminal 10 and the carrier amplifier 20. A second input matching circuit 32 is connected to an end portion on an opposite side of the input terminal 10, of the second input line 12. The peak amplifier 30 is connected to output of the second input matching circuit 32. The second input matching circuit 32 is connected between the input terminal 10 and the peak amplifier 30.

A first output line 41 is connected to output of the carrier amplifier 20. An output-side λ/4 electrical length line 45 for synthesizing an output signal of the carrier amplifier 20 and an output signal of the peak amplifier 30 is provided on the first output line 41. The output-side λ/4 electrical length line 45 has an electrical length that is an odd multiple of λ/4 of an amplifier signal. In other words, the electrical length of the output-side λ/4 electrical length line 45 is λ/4, 3λ/4, 5λ/4, . . . with respect to the wavelength λ of the amplified signal of the Doherty amplifier 100. The output-side λ/4 electrical length line 45 has an electrical length corresponding to a phase difference of the input-side λ/4 electrical length line 15. A second output line 42 is connected to output of the peak amplifier 30.

A signal from the first output line 41 and a signal from the second output line 42 are synthesized at the synthesizer 46 and output from the output terminal 40.

Operation of the Doherty amplifier 100 will be described next. Signals input from the input terminal 10 are respectively amplified at the first anterior stage amplifier 13 and the second anterior stage amplifier 14. The signal amplified at the first anterior stage amplifier 13 is input to the first input matching circuit 22. The signal amplified at the second anterior stage amplifier 14 is input to the second input matching circuit 32 via the input-side λ/4 electrical length line 15. The first input matching circuit 22 and the second input matching circuit 32 perform impedance matching so that an input loss does not occur at the carrier amplifier 20 and the peak amplifier 30. The input loss means reflection of the signal.

The carrier amplifier 20 and the peak amplifier 30 respectively amplify the signal input from the first input matching circuit 22 and the signal input from the second input matching circuit 32 and output the amplified signals. The carrier amplifier 20 and the peak amplifier 30 output the signals toward the outside in directions opposite to each other. An angle formed by signal output directions 61 and 62 of the carrier amplifier 20 and the peak amplifier 30 is 180 degrees. The carrier amplifier 20 outputs a signal to an opposite side of the peak amplifier 30, and the peak amplifier 30 outputs a signal to an opposite side of the carrier amplifier 20.

The signals output from the carrier amplifier 20 and the peak amplifier 30 are synthesized at the synthesizer 46 via the first output line 41 and the second output line 42 and output from the output terminal 40.

The carrier amplifier 20, the peak amplifier 30, the first anterior stage amplifier 13, the second anterior stage amplifier 14, the first input matching circuit 22 and the second input matching circuit 32 are, for example, constituted with semiconductor chips such as GaAs and GaN.

Typically, an amplifier which operates in a saturation range that is a higher output power range can achieve higher efficiency. Typically, a serial multistage amplifier, which achieves higher efficiency as the range comes closer to the saturation range, has weakness in low to medium output power. To achieve higher efficiency in low to medium output power, the Doherty amplifier includes two amplifiers having different operation ranges. The carrier amplifier and the peak amplifier which are two amplifiers provided in the Doherty amplifier have different operation classes. This enables the Doherty amplifier to achieve higher efficiency than a typical serial multistage amplifier in all output power range from low to high output power.

Typically, a communication device is desired to achieve multiple-input multiple-output (MIMO) such as 64T64R. Thus, in a communication device, there is a case where a number of power amplifiers are provided at one small antenna. Thus, improvement in high-temperature operating characteristics, reduction in size, and low cost are desired in addition to higher efficiency of the power amplifiers for preventing heat generation.

Figure 2:
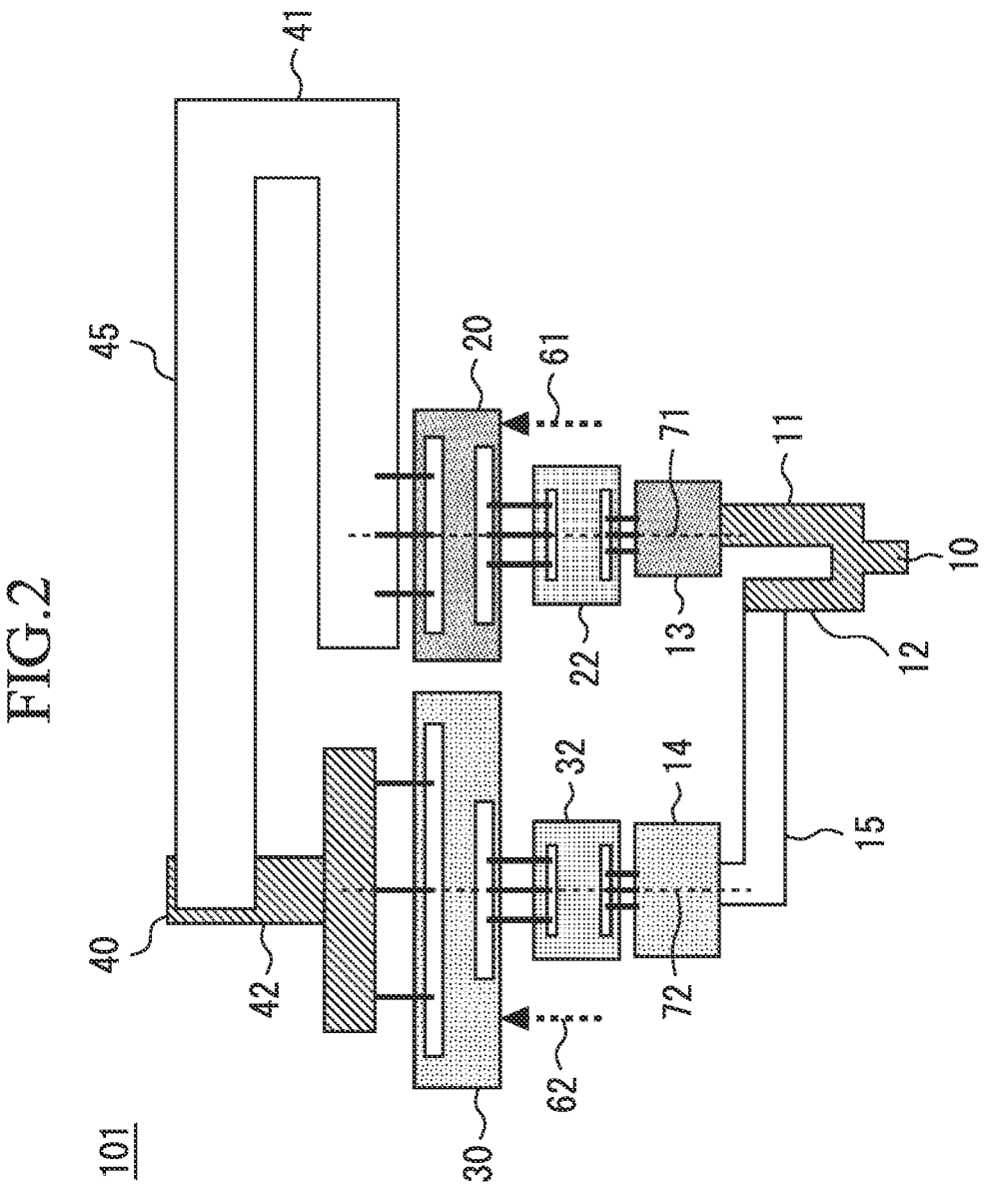
FIG. 2 is a plan view of a Doherty amplifier according to a comparative example.

FIG. 2 is a plan view of a Doherty amplifier 101 according to a comparative example. In the Doherty amplifier 101, the carrier amplifier 20 and the peak amplifier 30 are arranged side by side to prevent deterioration of distortion characteristics of an amplified signal. In this event, the carrier amplifier 20 and the peak amplifier 30 output signals in the same direction.

In such side-by-side arrangement, a layout area increases in one direction, which may increase a size of the device. Further, typically, a heat generation amount of the carrier amplifier and the peak amplifier is the largest during operation of the Doherty amplifier. In the side-by-side arrangement, the carrier amplifier 20 is adjacent to the peak amplifier 30. Thus, there is a possibility that characteristics may deteriorate upon high-temperature operation. Further, there is a possibility that signals may interfere with each other as a result of the carrier amplifier 20 and the peak amplifier 30 being closely arranged side by side.

Further, to secure favorable distortion characteristics, it is preferable to secure layout symmetry between the carrier amplifier 20 and the first input matching circuit 22 and layout symmetry between the peak amplifier 30 and the second input matching circuit 32 as well as symmetry between the carrier amplifier 20 and the peak amplifier 30. In the Doherty amplifier 101, a central line 71 of the carrier amplifier 20 matches a central line 71 of the first input matching circuit 22 to secure layout symmetry. In a similar manner, a central line 72 of the peak amplifier 30 matches a central line 72 of the second input matching circuit 32 to secure layout symmetry.

Here, in a layout illustrated in FIG. 2, as a result of the carrier amplifier 20 and the peak amplifier 30 being arranged side by side, an empty space is generated particularly between the first input matching circuit 22 and the second input matching circuit 32. This inhibits reduction in size of the device. Further, a communication device may be required to achieve further higher output power to expand a coverage area. It is therefore assumed that a total gate width Wgt of the carrier amplifier 20 and the peak amplifier 30 becomes greater. This results in a possibility that an empty space between the first input matching circuit 22 and the second input matching circuit 32 may become further larger.

In contrast, in the Doherty amplifier 100 according to the present embodiment, the carrier amplifier 20 and the peak amplifier 30 outputs signals toward the outside in directions opposite to each other. The carrier amplifier 20 and the peak amplifier 30 are arranged in a signal output direction 61 in which the carrier amplifier 20 outputs a signal. In the present embodiment, unlike with the Doherty amplifier 101 according to the comparative example, a long side of the carrier amplifier 20 and a long side of the peak amplifier 30 are not lined up in one direction, so that the layout size can be reduced. In other words, a width W illustrated in FIG. 1 can be reduced. Particularly, as transistor sizes of the carrier amplifier 20 and the peak amplifier 30 increase and Wgu (the number of transistor units) increases, an effect of reduction in layout size becomes larger.

Further, in the present embodiment, the first input matching circuit 22 and the second input matching circuit 32 are arranged between the carrier amplifier 20 and the peak amplifier 30. It is therefore possible to secure an interval between the carrier amplifier 20 and the peak amplifier 30 which are heat generation sources, so that it is possible to disperse heat generation portions. It is therefore possible to prevent deterioration of characteristics upon high-temperature operation. Further, a space between the carrier amplifier 20 and the peak amplifier 30 can be effectively utilized.

Further, a central line 70 of the carrier amplifier 20 matches the central line of the first input matching circuit 22, and the central line 70 of the peak amplifier 30 matches the central line of the second input matching circuit 32. Still further, the central line 70 of the carrier amplifier 20 matches the central line 70 of the peak amplifier 30. In this manner, in the present embodiment, the layout size can be reduced while symmetry of the layout that is a premise of favorable distortion characteristics, is secured.

Further, as a result of the carrier amplifier 20 and the peak amplifier 30 outputting signals in directions opposite to each other, the signal output directions 61 and 62 of the carrier amplifier 20 and the peak amplifier 30 do not run side by side. It is therefore possible to prevent interference of high-frequency signals.

In this manner, in the present embodiment, it is possible to obtain effects of reduction in size of the Doherty amplifier 100, improvement in high-temperature operating characteristics, low distortion characteristics and prevention of interference by devising layout.

As a comparative example of the present embodiment, there is, for example, a possible configuration in which the carrier amplifier 20 and the peak amplifier 30 output signals toward the inside, that is, toward each other. In a configuration in which signals are output in directions opposite to the directions in the present embodiment in this manner, it is assumed that a space for arranging the output-side λ/4 electrical length line 45 is required in a region between the carrier amplifier 20 and the peak amplifier 30. Thus, there is a possibility that it may be difficult to reduce a layout size.

For example, in an operating frequency with a high millimeter wave such as a 14 GHz band, the output-side λ/4 electrical length line 45 is typically small. However, in a sub 6 band, or the like, in a 4 GHz band to be used at a 5G base station, typically, the output-side λ/4 electrical length line 45 is large. Thus, if the output-side λ/4 electrical length line 45 is arranged in a region between the carrier amplifier 20 and the peak amplifier 30, a layout size may be increased. Thus, particularly, in a Doherty amplifier that amplifies a low frequency signal in a 4 GHz band, or the like, there is a possibility that reduction in size may be inhibited.

In contrast, the carrier amplifier 20 and the peak amplifier 30 in the present embodiment output signals toward the outside in directions opposite to each other. Thus, the output-side λ/4 electrical length line 45 is provided outside the region between the carrier amplifier 20 and the peak amplifier 30. It is therefore possible to reduce a layout size.

Note that a signal at an input side is smaller than a signal at an output side, and thus is less susceptible to a signal loss. Thus, a line width of the input-side λ/4 electrical length line 15 is smaller than a line width of the output-side λ/4 electrical length line 45. Thus, the input-side λ/4 electrical length line 15 is less likely to inhibit reduction in size. In a similar manner to the output-side λ/4 electrical length line 45, the input-side λ/4 electrical length line 15 may be constituted with a λ/4 electrical length line with a low signal loss or may be constituted with a surface mount device (SMD). While the λ/4 electrical length line constituted with the SMD has some signal loss, further reduction in size can be achieved.

In the present embodiment, the input-side λ/4 electrical length line 15 is provided on the peak amplifier 30 side, and the output-side λ/4 electrical length line 45 is provided on the carrier amplifier 20 side. The present disclosure is not limited to this, and the output-side λ/4 electrical length line 45 only requires to be connected between one of the carrier amplifier 20 and the peak amplifier 30, and the output terminal 40. Further, the input-side λ/4 electrical length line 15 only requires to be connected between the input terminal 10 and one of the first input matching circuit 22 and the second input matching circuit 32, to which the output-side λ/4 electrical length line 45 is not connected on the output side.

Further, arrangement of components illustrated in FIG. 1 is an example, and the arrangement is not limited thereto. For example, the central line 70 of the carrier amplifier 20 does not have to match the central line 70 of the peak amplifier 30.

These modifications can be applied, as appropriate, to Doherty amplifiers according to the following embodiments. Note that the Doherty amplifiers according to the following embodiments are similar to that of the first embodiment in many respects, and thus differences between the Doherty amplifiers according to the following embodiments and that of the first embodiment will be mainly described below.

Second Embodiment

Figure 3:
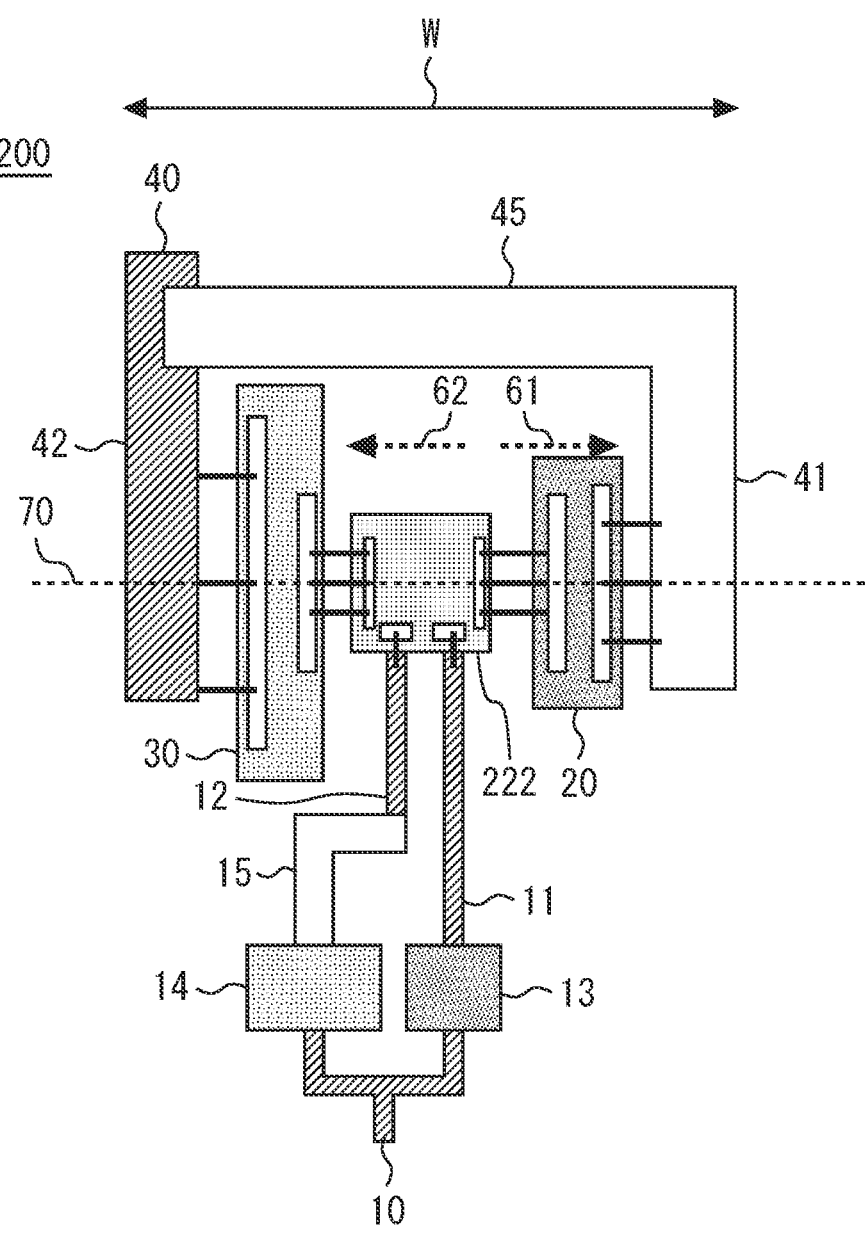
FIG. 3 is a plan view of a Doherty amplifier according to a second embodiment.

FIG. 3 is a plan view of a Doherty amplifier 200 according to a second embodiment. The present embodiment is different from the first embodiment in that the first input matching circuit 22 and the second input matching circuit 32 are formed in one chip 222. Other configurations are similar to those in the first embodiment. The chip 222 is, for example, a semiconductor chip such as GaAs and GaN.

In the present embodiment, the input matching circuits can be made smaller in addition to the effects of the first embodiment. Further, four chips of the carrier amplifier 20, the peak amplifier 30, the first input matching circuit 22 and the second input matching circuit 32 in the first embodiment can be reduced to three chips in the present embodiment. It is therefore possible to reduce the number of times of implementation, an implementation period and cost in an implementation process.

Third Embodiment

Figure 4:
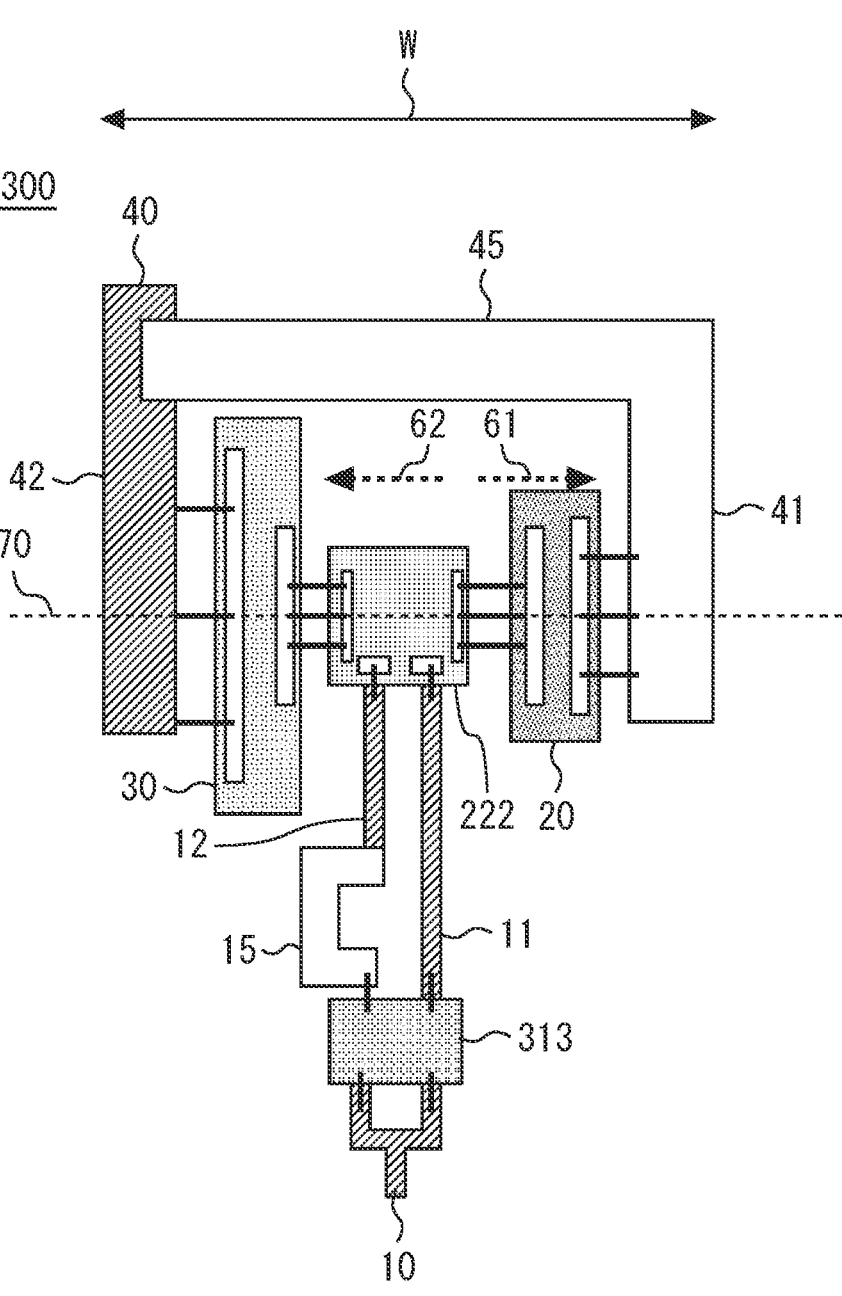
FIG. 4 is a plan view of a Doherty amplifier according to a third embodiment.

FIG. 4 is a plan view of a Doherty amplifier 300 according to a third embodiment. In the first embodiment, the first anterior stage amplifier 13 is connected between the first input matching circuit 22 and the input terminal 10, and the second anterior stage amplifier 14 is connected between the second input matching circuit 32 and the input terminal 10. In the present embodiment, the first anterior stage amplifier 13 and the second anterior stage amplifier 14 are formed in one chip 313. Other configurations are similar to those in the second embodiment. The chip 313 is, for example, a semiconductor chip such as GaAs and GaN.

In the present embodiment, the anterior stage amplifiers can be made smaller in addition to the effects of the second embodiment. Further, five chips of the carrier amplifier 20, the peak amplifier 30, the chip 222, the first anterior stage amplifier 13 and the second anterior stage amplifier 14 in the second embodiment can be reduced to four chips in the present embodiment. It is therefore possible to reduce the number of times of implementation, an implementation period and cost in an implementation process.

Fourth Embodiment

Figure 5:
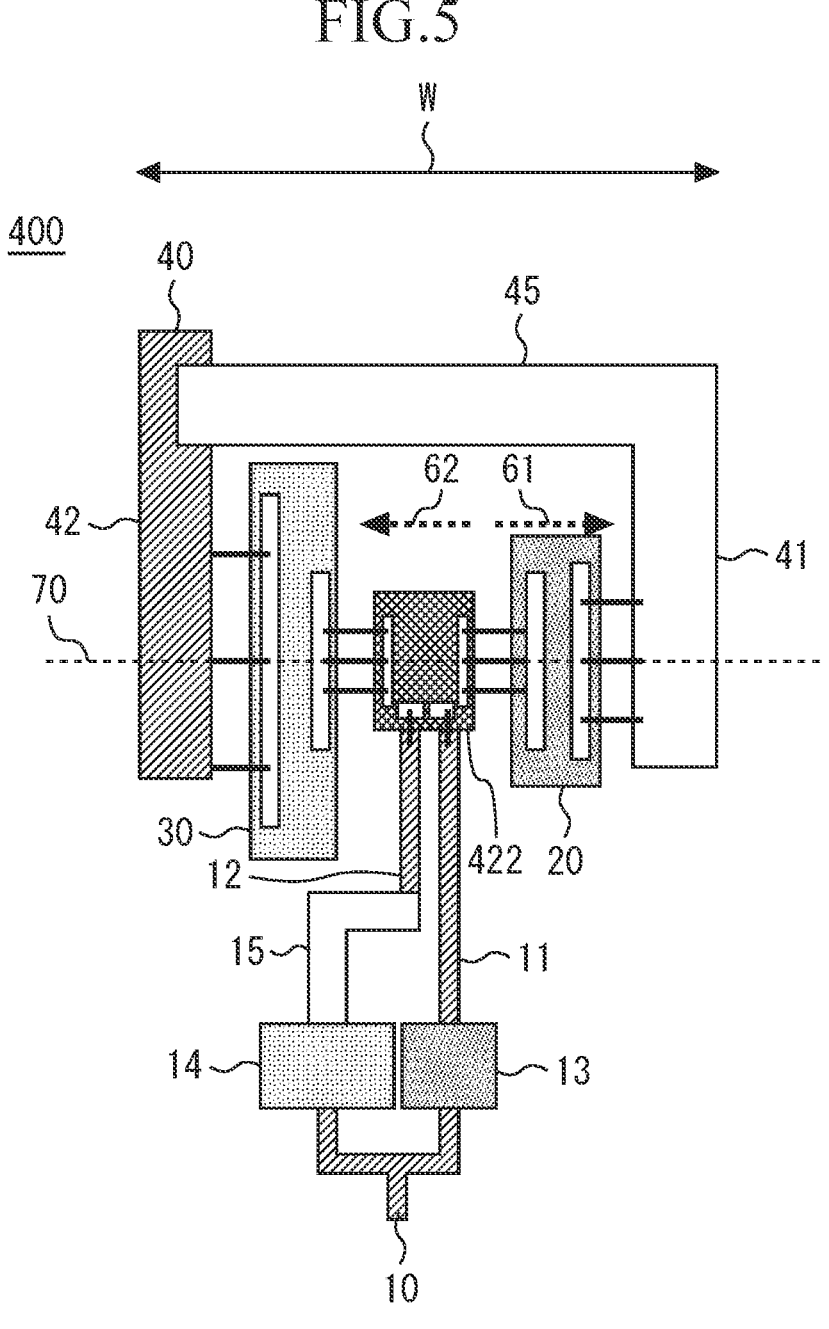
FIG. 5 is a plan view of a Doherty amplifier according to a fourth embodiment.

FIG. 5 is a plan view of a Doherty amplifier 400 according to a fourth embodiment. In the present embodiment, the first input matching circuit 22 and the second input matching circuit 32 are formed in one integrated passive device (IPD) 422. Other configurations are similar to those in the second embodiment.

In the present embodiment, further reduction in size can be achieved by the IPD 422 in addition to the effects of the second embodiment. The IPD 422 is also referred to as an integrated passive device, an integrated passive component or an embedded passive component. The IPD 422 is an electronic component in which a resistor, a capacitor, an inductor, a microstrip line, an impedance matching element, a balun or a combination thereof are integrated in the same package or on the same substrate. Use of the IPD 422 enables further reduction in size compared to matching circuits using GaN, GaAs or SMD.

Fifth Embodiment

Figure 6:
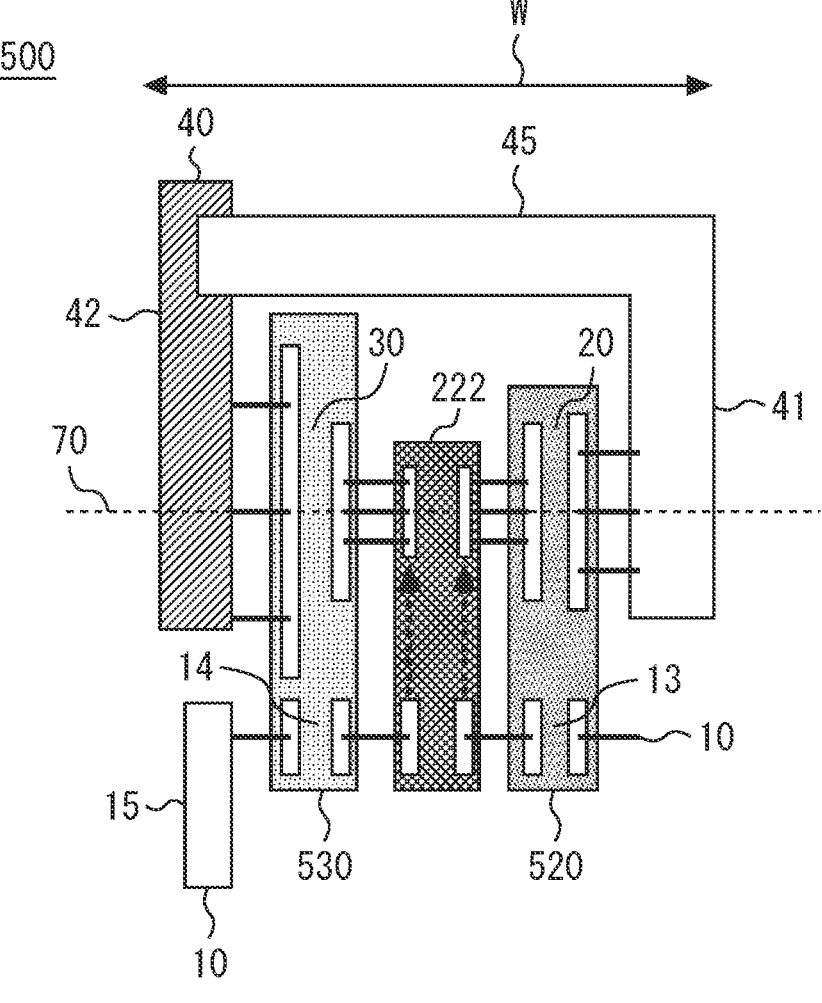
FIG. 6 is a plan view of a Doherty amplifier according to a fifth embodiment.

FIG. 6 is a plan view of a Doherty amplifier 500 according to a fifth embodiment. In the present embodiment, the carrier amplifier 20 and the first anterior stage amplifier 13 are formed in one chip 520, and the peak amplifier 30 and the second anterior stage amplifier 14 are formed in one chip 530. Further, the input-side λ/4 electrical length line 15 is connected between the input terminal 10 and the second anterior stage amplifier 14. Other configurations are similar to those in the second embodiment.

In the present embodiment, further reduction in size can be achieved by the anterior stage amplifier and the posterior stage amplifier being formed in one chip, in addition to the effects of the second embodiment. Further, compared to the configuration of five chips in the second embodiment, according to the configuration of three chips in the present embodiment, it is possible to reduce the number of times of implementation, an implementation period and cost.

Further, the central line 70 of a portion in which the carrier amplifier 20 is formed in the chip 520 matches the central line 70 of a portion in which the first input matching circuit 22 is formed in the chip 222. Still further, the central line 70 of a portion in which the peak amplifier 30 is formed in the chip 530 matches the central line 70 of a portion in which the second input matching circuit 32 is formed in the chip 222. Further, the central line 70 of a portion in which the carrier amplifier 20 is formed in the chip 520 matches the central line 70 of a portion in which the peak amplifier 30 is formed in the chip 530. In this manner, also in the present embodiment, it is possible to secure symmetry of the layout that is a premise of favorable distortion characteristics.

As a modification of the present embodiment, only one of the carrier amplifier 20 and the first anterior stage amplifier 13 or the peak amplifier 30 and the second anterior stage amplifier 14 may be formed in one chip. Further, the chip 222 in the present embodiment may be an IPD.

Sixth Embodiment

Figure 7:
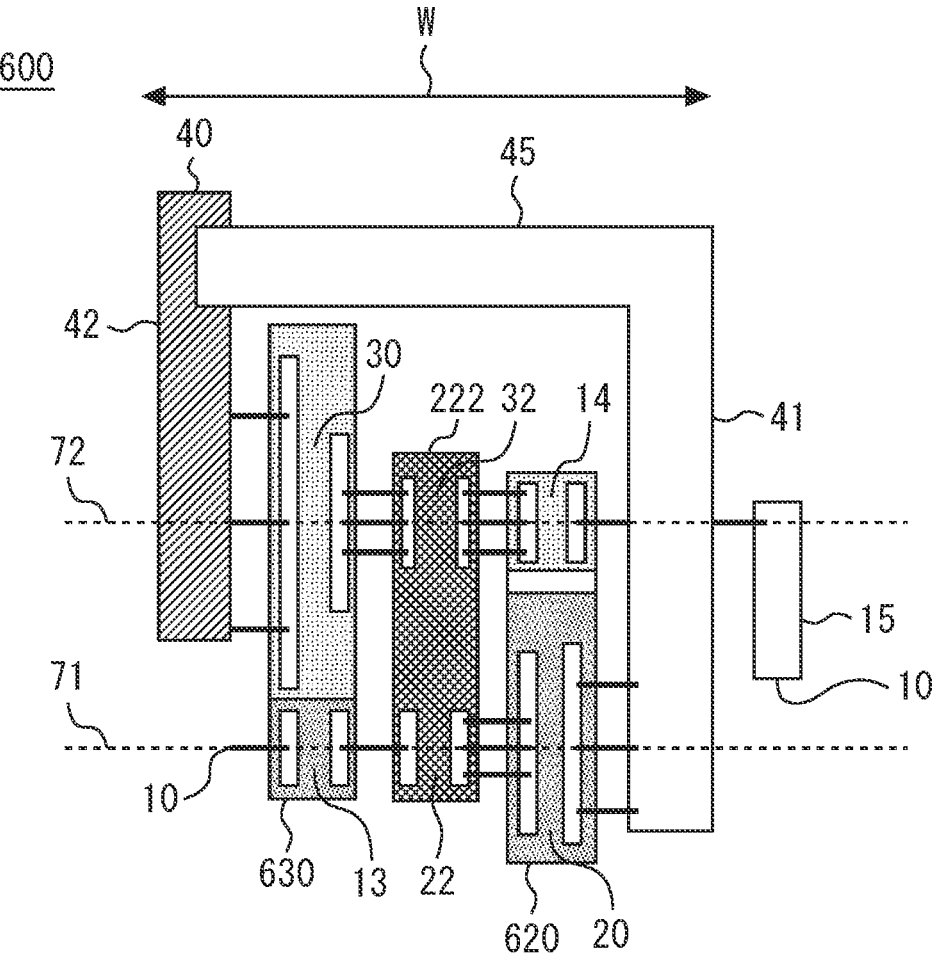
FIG. 7 is a plan view of a Doherty amplifier according to a sixth embodiment.

FIG. 7 is a plan view of a Doherty amplifier 600 according to a sixth embodiment. In the present embodiment, the carrier amplifier 20 and the second anterior stage amplifier 14 are formed in one chip 620, and the peak amplifier 30 and the first anterior stage amplifier 13 are formed in one chip 630. Further, the input-side λ/4 electrical length line 15 is connected between the input terminal 10 and the second anterior stage amplifier 14. Other configurations are similar to those in the second embodiment.

In the present embodiment, further reduction in size can be achieved by the anterior stage amplifier and the posterior stage amplifier being formed in one chip, in addition to the effects of the second embodiment. Further, compared to the configuration of five chips in the second embodiment, according to the configuration of three chips in the present embodiment, it is possible to reduce the number of times of implementation, an implementation period and cost.

Further, the central line 71 of a portion in which the carrier amplifier 20 is formed in the chip 620 matches the central line 71 of a portion in which the first input matching circuit 22 is formed in the chip 222. Still further, the central line 72 of a portion in which the peak amplifier 30 is formed in the chip 630 matches the central line 72 of a portion in which the second input matching circuit 32 is formed in the chip 222. In this manner, also in the present embodiment, it is possible to secure symmetry of the layout that is a premise of favorable distortion characteristics.

As a modification of the present embodiment, only one of the carrier amplifier 20 and the second anterior stage amplifier 14 or the peak amplifier 30 and the first anterior stage amplifier 13 may be formed in one chip. Further, the chip 222 in the present embodiment may be an IPD.

Note that the technical features described in the above embodiments may be combined as appropriate.

REFERENCE SIGNS LIST

10 input terminal, 11 first input line, 12 second input line, 13 first anterior stage amplifier, 14 second anterior stage amplifier, 15 λ/4 electrical length line, 16 divider, 20 carrier amplifier, 22 first input matching circuit, 30 peak amplifier, 32 second input matching circuit, 40 output terminal, 41 first output line, 42 second output line, 45 λ/4 electrical length line, 46 synthesizer, 61 signal output direction, 70 central line, 71 central line, 72 central line, 100, 101, 200 Doherty amplifier, 222 chip, 300 Doherty amplifier, 313 chip, 400, 500 Doherty amplifier, 520, 530 chip, 600 Doherty amplifier, 620, 630 chip

The invention claimed is:

1. A Doherty amplifier comprising:
an input terminal;
an output terminal;
a carrier amplifier connected between the input terminal and the output terminal;
a peak amplifier connected in parallel to the carrier amplifier between the input terminal and the output terminal;
a first input matching circuit connected between the input terminal and the carrier amplifier; and
a second input matching circuit connected between the input terminal and the peak amplifier,
wherein an output of the carrier amplifier faces a first direction away from the first input matching circuit and an output of the peak amplifier faces a second direction away from the second input matching circuit, and
the output of the carrier amplifier and the output of the peak amplifier are connected to the output terminal passing outside a region between the carrier amplifier and the peak amplifier.

2. The Doherty amplifier according to claim 1, wherein the carrier amplifier and the peak amplifier are arranged in a direction in which the carrier amplifier outputs a signal.

3. The Doherty amplifier according to claim 1, wherein the first input matching circuit and the second input matching circuit are arranged between the carrier amplifier and the peak amplifier.

4. The Doherty amplifier according to claim 1,
wherein a central line of the carrier amplifier matches a central line of the first input matching circuit, and
a central line of the peak amplifier matches a central line of the second input matching circuit.

5. The Doherty amplifier according to claim 1, comprising:

an output-side λ/4 electrical length line connected between one of the carrier amplifier and the peak amplifier, and the output terminal; and an input-side λ/4 electrical length line connected between the input terminal and one of the first input matching circuit and the second input matching circuit to which the output-side λ/4 electrical length line is not connected on an output side, wherein the output-side λ/4 electrical length line is provided outside the region between the carrier amplifier and the peak amplifier.

6. The Doherty amplifier according to claim 1, wherein the first input matching circuit and the second input matching circuit are formed in one chip.

7. The Doherty amplifier according to claim 6, wherein the first input matching circuit and the second input matching circuit are formed in one integrated passive device.

8. The Doherty amplifier according to claim 1, comprising:

a first anterior stage amplifier connected between the first input matching circuit and the input terminal; and a second anterior stage amplifier connected between the second input matching circuit and the input terminal, wherein the first anterior stage amplifier and the second anterior stage amplifier are formed in one chip.

9. The Doherty amplifier according to claim 1, comprising:

a first anterior stage amplifier connected between the first input matching circuit and the input terminal; and a second anterior stage amplifier connected between the second input matching circuit and the input terminal, wherein the carrier amplifier and the first anterior stage amplifier are formed in one chip, and the peak amplifier and the second anterior stage amplifier are formed in one chip.

10. The Doherty amplifier according to claim 1, comprising:

a first anterior stage amplifier connected between the first input matching circuit and the input terminal; and a second anterior stage amplifier connected between the second input matching circuit and the input terminal, wherein the carrier amplifier and the second anterior stage amplifier are formed in one chip, and the peak amplifier and the first anterior stage amplifier are formed in one chip.

* * * * *